(12) United States Patent
Park et al.

(10) Patent No.: US 6,930,450 B2
(45) Date of Patent: Aug. 16, 2005

(54) ORGANIC ELECTRO-LUMINESCENCE DEVICE AND FABRICATING METHOD THEREOF

(75) Inventors: Jae-Yong Park, Gyeonggi-Do (KR); Kwan-Soo Kim, Gyeonggi-Do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/608,117

(22) Filed: Jun. 30, 2003

(65) Prior Publication Data

US 2004/0027066 A1 Feb. 12, 2004

(30) Foreign Application Priority Data

Aug. 8, 2002 (KR) .............................. 10-2002-0046866

(51) Int. Cl.[7] .................................................. H01J 1/62
(52) U.S. Cl. ...................................... 313/512; 313/504
(58) Field of Search ................................. 313/504, 506, 313/511, 512, 554, 553; 315/169.3; 345/36, 45, 76

(56) References Cited

U.S. PATENT DOCUMENTS

| | | | | |
|---|---|---|---|---|
| 5,804,917 A | * | 9/1998 | Takahashi et al. | 313/504 |
| 6,175,186 B1 | * | 1/2001 | Matsuura et al. | 313/483 |
| 6,559,594 B2 | * | 5/2003 | Fukunaga et al. | 313/506 |
| 6,740,190 B2 | * | 5/2004 | Takase | 156/267 |
| 2002/0180371 A1 | * | 12/2002 | Yamazaki et al. | 315/169.3 |
| 2003/0122476 A1 | * | 7/2003 | Wang et al. | 313/493 |
| 2003/0190763 A1 | * | 10/2003 | Cok et al. | 438/22 |

FOREIGN PATENT DOCUMENTS

JP     2001076886 A   *   3/2001     .......... H05B/33/28

* cited by examiner

Primary Examiner—Vip Patel
Assistant Examiner—Glenn Zimmerman
(74) Attorney, Agent, or Firm—Morgan, Lewis & Bockius LLP (57) ABSTRACT

An organic electroluminescence device includes a first substrate, a first electrode layer formed over the first substrate, an organic light emitting layer formed over the first substrate, a second electrode layer formed over the organic light emitting layer, a second substrate, a seal pattern on an outer portion of the first substrate or the second substrate for forming a cell gap between the two substrates and for attaching the two substrates, and a plurality of cell gap maintaining structures located between the first substrate and the second substrate.

21 Claims, 6 Drawing Sheets

ORGANIC ELECTRO-LUMINESCENCE DEVICE AND FABRICATING METHOD THEREOF

The present invention claims the benefit of Korean Patent Application No. 2002-46866 filed in Korea on Aug. 8, 2002, which is hereby incorporated by reference.

BACKGROUND OF THE INVENTION

1. Field of the Invention

The present invention relates to an organic electroluminescence device which is able to prevent the device from being damaged due to an outer shock and a fabrication method.

2. Description of the Related Art

Large flat panel displays having various functions that are essential in the image industry field of the $21^{st}$ century information society. Flat panel displays include displays using an organic material and display using an inorganic material. The flat panel displays using the organic material comprises liquid crystal display (LCD), which is in wide use, and electroluminescence display (ELD), plasma display panel (PDP) and field emission display (FED).

The organic ELD is a flat panel display device using an electroluminescence phenomenon, that is, light is generated when an electric field greater than a certain degree is applied across an electroluminescence material. The organic ELD has the advantages of rapid response time, when compared to an LCD device, and high brightness. Research in organic ELD is proceeding in the basic light emitting device and is actively being applied in developing pixels for a large flat panel display.

Figure 1:
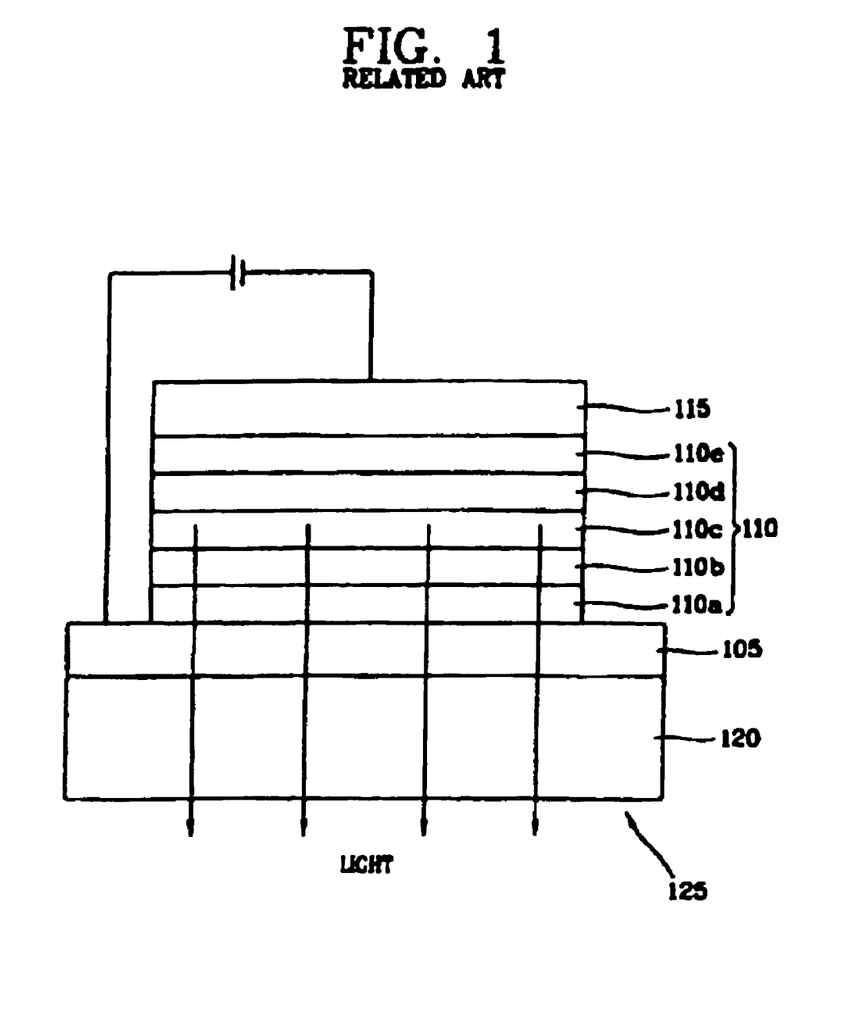
FIG. 1 is a cross-sectional view showing a related art electroluminescence device.

FIG. 1 is a view showing a related organic ELD. As shown in FIG. 1, the organic ELD includes: a transparent substrate 125; an anode electrode 105 of transparent material, such as indium-tin-oxide (ITO), formed on a transparent substrate 120; an organic light emitting layer 110 formed on the anode electrode 105, a cathode electrode 115 having a low work function disposed on the an organic light emitting layer 110. The transparent substrate 120, the electrode layers 105 and 115 and the organic light emitting layer 110 are all referred to as a lower substrate 125.

The organic light emitting layer 110 comprises a plurality of layers for emitting the light smoothly, generally includes: a hole injection layer 110a, a hole transporting layer 110b, a light emitting layer 110c, an electron transporting layer 110d and an electron injecting layer 110e. And when current is applied, the holes from the anode electrode 105 and electrons from the cathode electrode 115 are injected into the organic layer to form exciton on the light emitting layer 110c, and as the exciton is extinguished, the light corresponding to the difference between energies of the lowest unoccupied molecular orbital (LOMO) and the highest occupied molecular orbital (HOMO).

Figure 2A:
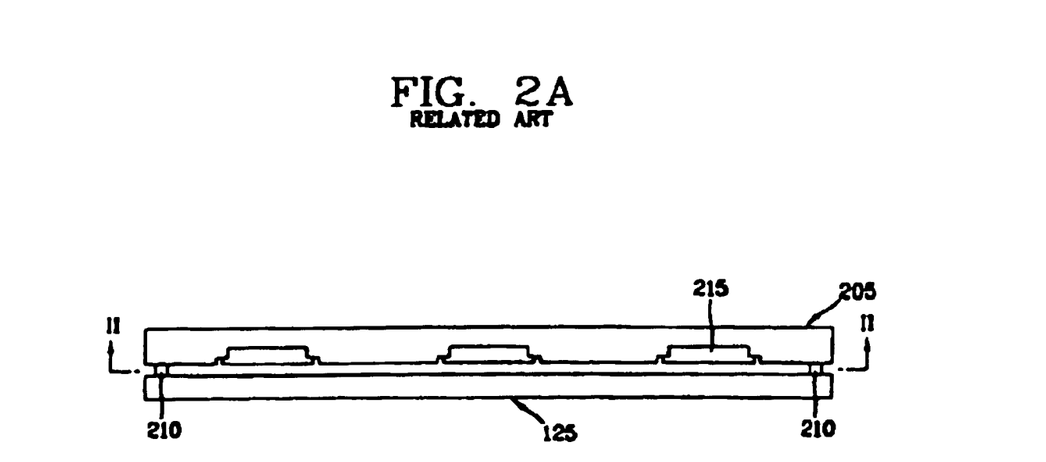
FIG. 2A is a cross sectional view showing a side surface of a related art organic ELD.
Figure 2B:
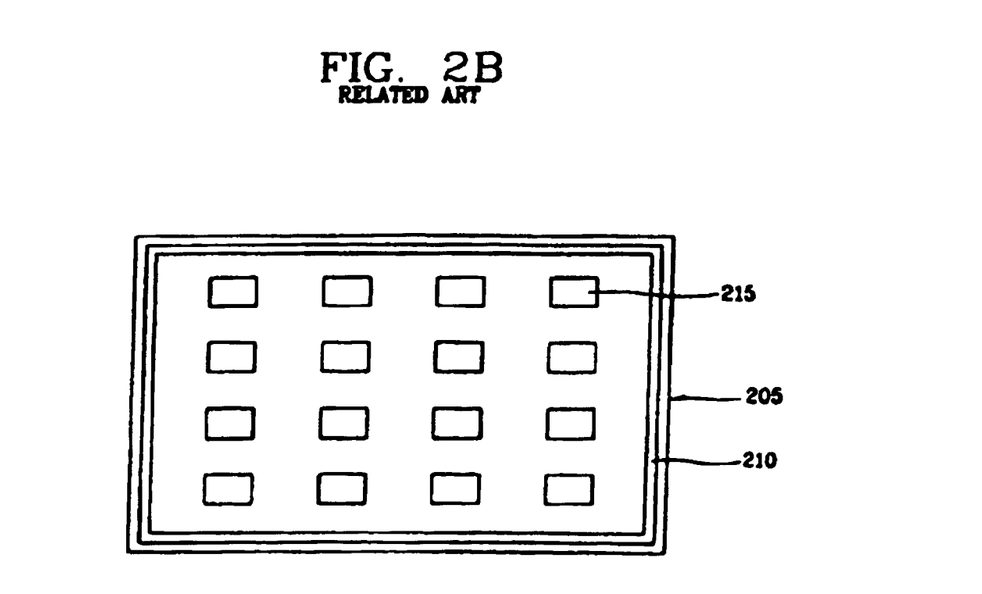
FIG. 2B is a plan view showing a related art organic ELD.

FIGS. 2A and 2B are side cross sectional view and plane view showing an organic ELD. As shown in FIG. 2A, an upper substrate 205 for encapsulating the lower substrate 125 is formed on upper part of the lower substrate 125. Generally, the organic light emitting layer is easily contaminated by humidity or impurities from the outside. In the case when the organic light emitting layer is contaminated by the humidity or impurities, the organic ELD has inferior display qualities. To block the humidity from entering into the organic ELD and to protect the device from outside impurities, the upper substrate 205 is attached to the lower substrate 125 by a seal pattern 210.

FIG. 2B is a plane sectional view in line 11—11 direction shown in FIG. 2A. As shown in FIG. 2B, the upper substrate 205 and the lower substrate 215 are attached to each other by the seal pattern 210 printed on an outer portion of the upper substrate 205. On the other hand, in the case when the organic light emitting layer is in contact with oxygen or humidity, the organic light emitting layer dissolves and the luminescent property of the organic light emitting layer decreases. Therefore, a desiccant film 215, including nylon, is attached on an area of the upper substrate 205 corresponding to the organic light emitting layer to prevent oxygen or humidity from infiltrating into the organic light emitting layer 110.

The upper substrate 205 and the lower substrate 125 are constructed, as discussed above, and attached together with the seal pattern 210. The cell gap between the upper substrate 205 and the lower substrate 125 is determined and maintained by the seal pattern 210. Using the seal pattern 210 to maintain and determine the cell gap is similar to the use of a seal pattern in an LCD device. In the LCD device, if the lower substrate on which TFT is formed and the upper substrate on which color filter are compressed together there is no problem since the liquid crystal is somewhat resilient.

In the case of the organic ELD, if the pressure is applied to the lower substrate 125 or to the upper substrate 205 after attaching the upper and lower substrates 205 and 125, the electrode layers 105 and 115 or the organic light emitting layer 110 can be damaged. Because the electrode layers 105 and 115 and the organic light emitting layer 110 are formed with a vacuum deposition method, the strength and adhesion property of the layers are very weak and can be easily separated by a little pressure. The damage to the electrode layers 105 and 115 or the organic light emitting layer 110 is even worse due to the bending of the substrate. More particularly, a point defect can occur. A point defect is when a pixel unit becomes inoperable. Thus, pressure applied to an organic ELD, which bends the substrate of an organic ELD, can cause severe defects across the display panel of an organic ELD.

SUMMARY OF THE INVENTION

Accordingly, the present invention is directed to an organic electro-luminescence device and fabricating method thereof that substantially obviates one or more of the problems due to limitations and disadvantages of the related art.

An object of the present invention is to prevent a substrate from being distorted by an outer shock to prevent an organic ELD from being damaged by forming a cell gap maintaining structure in an empty space within a seal pattern.

Additional features and advantages of the invention will be set forth in the description which follows, and in part will be apparent from the description, or may be learned by practice of the invention. The objectives and other advantages of the invention will be realized and attained by the features particularly pointed out in the written description and claims hereof as well as the appended drawings.

To achieve the object of the present invention, as embodied and broadly described herein, there is provided an organic electroluminescence device (ELD) includes: a first substrate; a first electrode layer formed over the first substrate; an organic light emitting layer formed over the first substrate; a second electrode layer formed over the organic light emitting layer; a second substrate; a seal pattern on an outer portion of the first substrate or the second substrate for forming a cell gap between the two substrates and for attaching the two substrates; and a plurality of cell gap maintaining structures located between the first substrate and the second substrate within the seal pattern.

In another aspect of the present invention, there is provided an organic electroluminscence device includes: an organic light emitting substrate on which an organic light emitting layer is formed to output the light according to signal application; an encapsulating substrate attached with the organic light emitting substrate for protecting the organic light emitting substrate; and a cell gap maintaining structure located between the organic light emitting substrate and the encapsulating substrate for maintaining the gap between the organic light emitting substrate and the encapsulating substrate.

In another aspect of the present invention, there is provided a fabrication method of an organic ELD includes: forming a first electrode layer on an upper part of a first substrate; forming an organic light emitting layer on an upper part of the first electrode layer; forming a second electrode layer on an upper part of the organic light emitting layer; forming a cell gap maintaining structure between the first substrate and a second substrate; forming a seal pattern on an outer portion of the first substrate or the second substrate; and attaching the first substrate and the second substrate using the seal pattern.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 3A:
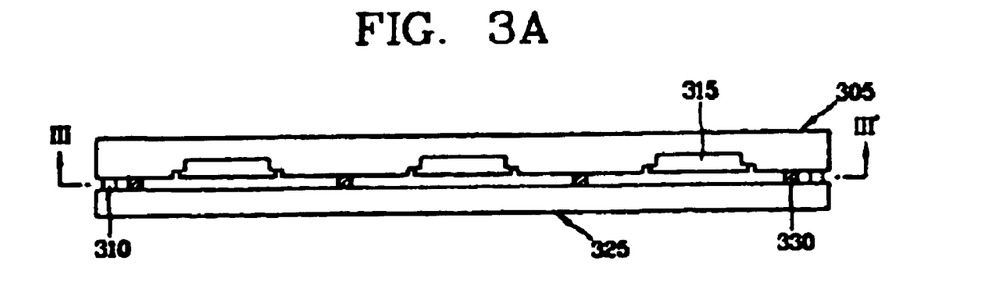
FIG. 3A and FIG. 3A' are cross sectional views respectively showing a side surface of an organic ELD in accordance with embodiments of the present invention.
Figure 3B:
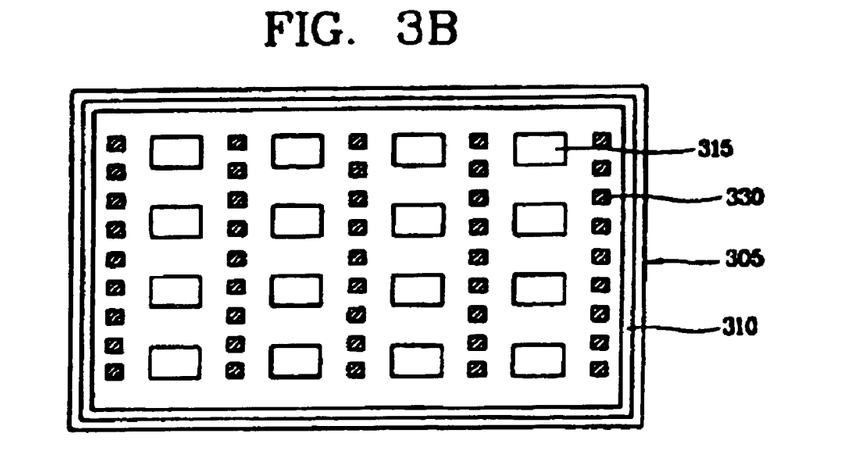
FIG. 3B is a plan view showing the organic ELD according to first embodiment of the present invention.
Figure 3C:
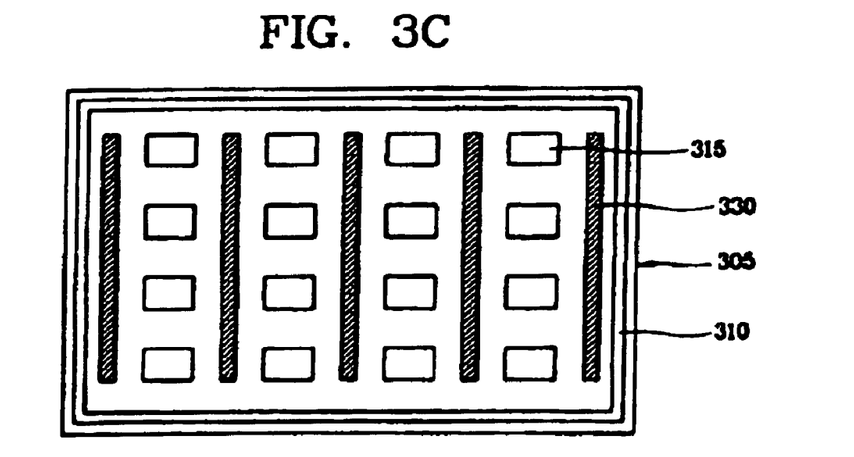
FIG. 3C is a plan view showing the organic ELD according to second embodiment of the present invention.

FIGS. 3A to 3C are views showing an organic electroluminescence device (ELD) according to an embodiment of the present invention. FIG. 3A and FIG. 3A' are cross sectional views respectively showing the organic ELD in accordance with embodiments of the present invention. FIG. 3B is a cross sectional view of a first embodiment in the direction III–III' shown in FIG. 3A and FIG. 3A'. FIG. 3C is cross sectional views of a second embodiment in the direction III–III' shown in FIG. 3A.

As shown in FIG. 3A, the organic ELD according to an embodiment of the present invention comprises a lower substrate 325 on which a TFT and an organic light emitting layer (not shown) are formed, an upper substrate 305 on which a desiccant film 315 is formed. The desiccant film 315 is formed on an area of the upper substrate 305 corresponding to the area of the lower substrate 325 where the organic light emitting layer is formed. The desiccant film 315 is for blocking the humidity infiltrating into the organic light emitting layer.

The lower and upper substrates 325 and 305 are attached by a seal pattern 310. In addition, a cell gap maintaining structure 330 is located between the lower substrate 325 and the upper substrate 305 to maintain a consistent cell gap in the organic ELD. However, the cell gap maintaining structure 330 does not block the light emitted from the organic light emitting layer. The cell gap maintaining structure 330 provides support between the upper substrate 305 and the lower substrate 325. Therefore, when the upper substrate 305 and the lower substrate 325 are attached, the cell gap maintaining structure 330 prevents the bending of the upper substrate 305 and the lower substrate 325. The cell gap maintaining structure 330 should not be formed to overlap the desiccant film 315. Overlapping the desiccant film 315 will reduce the function of the desiccant film 315. FIG. 3A' is similar to FIG. 3A except that a passivation layer 320 is formed on an upper part of the lower substrate 325 and the cell gap maintaining structure 330 is formed over the passivation layer. Moreover, as shown in FIG. 3A', a height of the cell gap maintaining structure 330 is lower than the cell gap between the lower and upper substrates 325 and 305.

FIGS. 3B and 3C show embodiments of the cell gap maintaining structure 330 pattern, which can be formed on the upper substrate 305. As shown in FIG. 3B, the cell gap maintaining structure 330 may be formed discontinuously in width direction (arranging direction of the desiccant film), and may be formed as a stripe as shown in FIG. 3C. The depictions of the cell maintaining structures in FIGS. 3A and 3B are only examples of the present invention. The cell gap maintaining structure according to the present invention is not limited to the examples shown in FIGS. 3B and 3C. However, a cell gap maintaining structure should be supplied throughout the entire organic ELD such that external pressure applied to the device will be distributed across a large area of both the upper and lower substrates 305 and 325.

The cell gap maintaining structure 330 can be a patterned spacer protruding from the upper substrate 305 or from the lower substrate 325. In the case when a solid spacer, such as spherical balls, is used, the organic light emitting layer may be damaged. Accordingly, a flexible patterned spacer is used. Also, a patterned spacer can be formed exactly at a desired position. The cell gap maintaining structure 330 including the patterned spacer can be formed on the upper substrate 305, on the lower substrate 325 or both.

In reference to FIGS. 4A through 4E, a fabrication process in the case when the cell gap maintaining structure 330 is formed on the upper substrate 305 will be described. FIGS. 4A to 4E are cross sectional views illustrating a method for fabricating the organic ELD according to an embodiment of the present invention. FIGS. 5A and 5B are views showing a mask on which a pattern is used to fabricate the organic ELD according to an embodiments of the present invention.

Figure 4A:
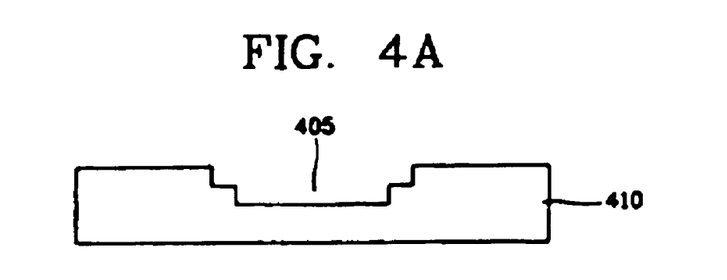
FIGS. 4A to 4E are processing cross sectional views illustrating a method for fabricating the organic ELD according to an embodiment of the present invention.
Figure 4B:
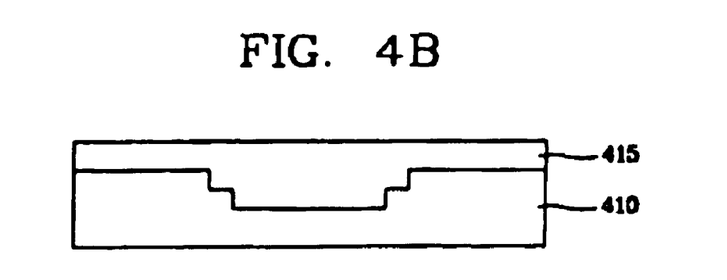
Figure 5A:
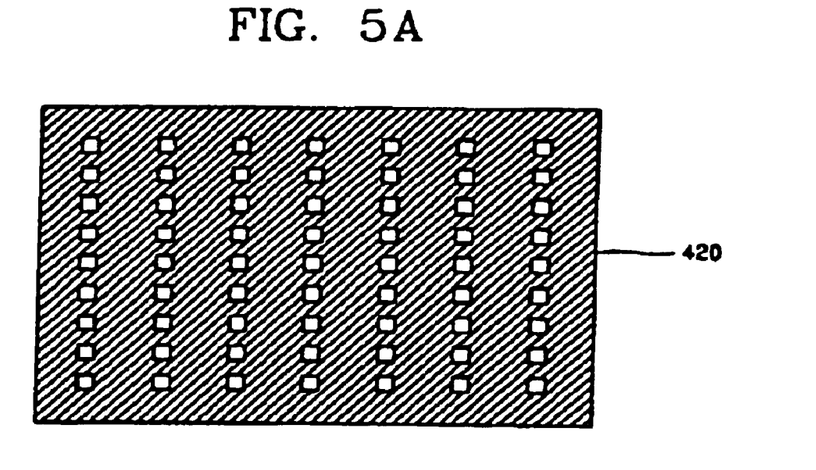
FIGS. 5A and 5B are views showing a mask on which a pattern is used to fabricate the organic ELD according to an embodiments of the present invention.
Figure 5B:
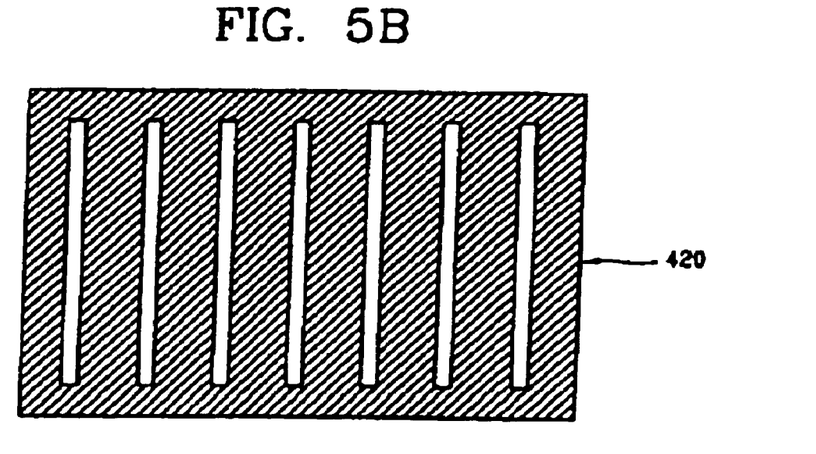

First, as shown in FIG. 4A, the substrate 410 is etched to form a plurality of recesses 405 for installing the desiccant film. As shown in FIG. 4B, an organic layer 415 is formed to a predetermined thickness on an upper part of the substrate 410 on which the recesses 405 are formed. After the organic layer 415 is formed, a mask 420 on which a pattern of the cell gap maintaining structure which will be formed is formed is prepared. In the case when a negative photolithography method is used, the ultraviolet ray is irradiated through white parts, and in the case when a positive photolithography method is used, the ultraviolet ray is irradiated through the lined part.

Figure 4C:
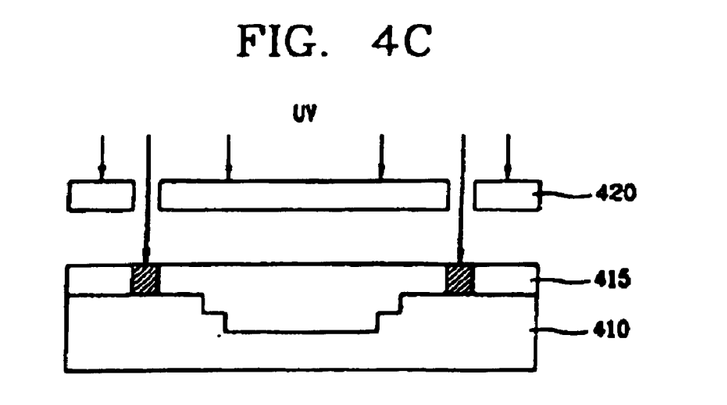
Figure 4D:
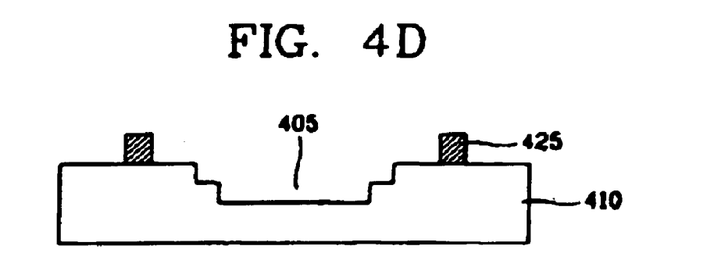

In the case when the mask shown in FIG. 5A is used, the cell gap maintaining structure having the pattern shown in FIG. 3B is formed. In the case when the mask shown in FIG. 5B is used, the cell gap maintaining structure of the pattern shown in FIG. 3C is formed. As shown in FIG. 4c, the mask 420 is disposed on the upper part of the substrate 410 on which the organic layer 415 is formed. Then, the ultraviolet ray is irradiated onto the mask 420. In the case when the negative photolithography method is used, the area of the organic layer 415 exposed to the ultraviolet ray through the pattern of the mask is not reacted with a developer in a developing process later, and therefore, it is not removed, but remains to form the cell gap maintaining structure. FIG. 4D shows the pattern of formed cell gap maintaining structure 425. In the case when the positive photolithography method is used, the mask corresponding to the positive photolithography method should be used.

Figure 4E:
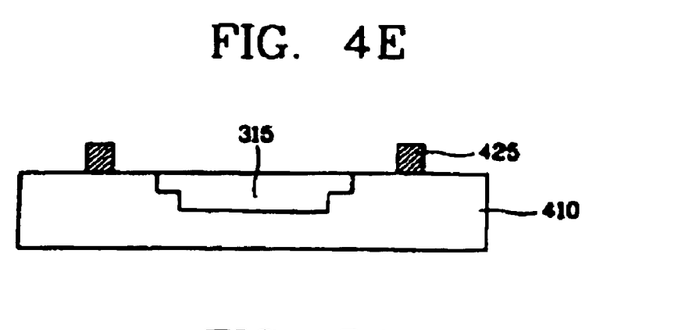

As shown in FIG. 4E, the desiccant film 315 is installed on the recesses 405 which is exposed by removing the organic layer 415. The desiccant film 315 is installed at the last stage of the process so that the function thereof is not damaged by the organic layer. The organic layer remains after the developing process is applied for the cell gap maintaining structure 425.

The thickness of the organic layer 415 is the same as or smaller than the cell gap in the organic ELD. If the thickness of the organic layer 415 is thicker than the thickness of the cell gap, the thickness of the cell gap maintaining structure formed after completing the process is also thicker than the thickness of the cell gap, and therefore, it may stimulate the lower substrate. When the upper substrate fabricated in above process and the lower substrate in which the electrode layer and the organic light emitting layer are formed in the vacuum deposition method are attached using the seal pattern, the organic ELD is completed.

As described above, the cell gap maintaining structure may be formed on the lower substrate. However, the process for forming the cell gap maintaining structure on the lower substrate does not require the process of etching the substrate or the process of forming the desiccant film as in the process for forming it on the upper substrate. Therefore, the process for forming the cell gap maintaining structure on the lower substrate is very simple. The upper substrate is etched to form the desiccant film thereon besides the process for forming the cell gap maintaining structure.

The fabrication process for the case in which the cell gap maintaining structure is formed on the lower substrate will be briefly described as follows. First, an organic layer is applied to a predetermined thickness on an upper part of the lower substrate, on which a switching device, the organic light emitting layer and the electrode layer are formed. The organic layer is applied having a thickness, which is the same as the desired thickness for the cell gap that is to be determined and maintained. A passivation layer can be formed before the organic layer is applied to protect the electrode layer. Next, the organic layer is patterned through the photolithography process so that the cell gap maintaining structure can be formed at the desired position. When the lower substrate fabricated in above method and the upper substrate on which the desiccant film is formed are attached using the seal pattern, the organic ELD is completed.

Detailed descriptions as above do not limit the technical range of the present invention thereto, but these should be interpreted as the preferred embodiments. For example, the pattern of the cell gap maintaining structure is not shown in FIG. 4, but it may be fabricated as a single body in which all parts are connected with each other. According to the embodiments of the present invention, the thickness of the cell gap is maintained to be constant throughout the entire area such that outside pressure can be evenly distributed throughout the device. Because the electrode layer and the organic light emitting layer of the organic ELD are formed with a vacuum deposition method, the strength of them is weak and they can be easily damaged. However, the present invention is able to prevent the electrode layer and the organic light emitting layer from being damaged by using cell gap maintaining structure to distribute pressure.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An organic electroluminscence device comprising:
    a first substrate;
    a first electrode layer formed over the first substrate;
    an organic light emitting layer formed over the first electrode layer;
    a second electrode layer formed over the organic light emitting layer;
    a second substrate;
    a seal pattern on an outer portion of the first substrate or the second substrate for forming a cell gap between the two substrates and for attaching the two substrates;
    a plurality of recesses on the second substrate for respectively receiving a plurality of desiccant films; and
    a plurality of cell gap maintaining structures located between the first substrate and the second substrate within the seal pattern and arranged alternately with the plurality of desiccant films.

2. The device of claim 1 further comprising a passivation layer formed on the upper part of the second electrode layer.

3. The device of claim 1, wherein the cell gap maintaining structure is formed over the passivation layer.

4. The device of claim 1, wherein the cell gap maintaining structures are arranged with predetermined intervals therebetween in longitudinal and transverse directions between the first and second substrates.

5. The device of claim 1, wherein the cell gap maintaining structure is made of an organic material.

6. The device of claim 1, wherein the cell gap maintaining structures are arranged discontinuously.

7. The device of claim 1, wherein the cell gap maintaining structure is formed on the second substrate except where the desiccant film is formed.

8. The device of claim 1, wherein a height of the cell gap maintaining structure is lower than the cell gap between the first substrate and the second substrate.

9. The device of claim 1, wherein the height of the cell gap maintaining structure is same as the cell gap between the first substrate and the second substrate.

10. An organic electroluminscence device comprising:
   an organic light emitting substrate on which an organic light emitting layer is formed to output the light according to signal application;
   an encapsulating substrate attached with the organic light emitting substrate for protecting the organic light emitting substrate;
   a plurality of recesses on the encapsulating substrate for respectively receiving a plurality of desiccant films; and
   a plurality of cell gap maintaining structures located between the organic light emitting substrate and the encapsulating substrate, and arranged alternately with the plurality of recesses.

11. The device of claim 10, wherein the cell gap maintaining structure is an organic pattern.

12. The device of claim 10, wherein the cell gap maintaining structure is formed as a stripe.

13. An organic electroluminscence device comprising:
   a first substrate;
   a first electrode layer formed over the first substrate;
   an organic light emitting layer formed over the first electrode layer;
   a second electrode layer formed over the organic light emitting layer;
   a second substrate;
   a seal pattern on an outer portion of the first substrate or the second substrate for forming a cell gap between the two substrates and for attaching the two substrates;
   a plurality of recesses on the second substrate for respectively receiving a plurality of desiccant films; and
   means for maintaining a cell gap located between the first substrate and the second substrate within the seal pattern and arranged alternately with the plurality of recesses.

14. The device of claim 1 further comprising a passivation layer formed on the upper part of the second electrode layer.

15. The device of claim 13, wherein the means for maintaining a cell gap is formed over the passivation layer.

16. The device of claim 13, wherein the means for maintaining a cell gap is arranged with predetermined intervals therebetween in longitudinal and transverse directions between the first and second substrates.

17. The device of claim 13, wherein the means for maintaining a cell gap is made of an organic material.

18. The device of claim 13, wherein the means for maintaining a cell gap is arranged discontinuously on at least one of the first and second substrates.

19. The device of claim 13, wherein the means for maintaining a cell gap is formed on the second substrate except where the desiccant film is formed.

20. The device of claim 13, wherein a height of the means for maintaining a cell gap is lower than the cell gap between the first substrate and the second substrate.

21. The device of claim 13, the height of the means for maintaining a cell gap is same as the cell gap between the first substrate and the second substrate.

* * * * *